(12) United States Patent
Chang (10) Patent No.: US 7,034,573 B1
(45) Date of Patent: Apr. 25, 2006

(54) LEVEL SHIFTER WITHOUT DC CURRENT FLOW

(75) Inventor: Ching-Rong Chang, Hsin-Chu County (TW)

(73) Assignee: Infineon-Admtek Co., Ltd., Hsin-Chu (TW)

( * ) Notice: Subject to any disclaimer, the term of this patent is extended or adjusted under 35 U.S.C. 154(b) by 0 days.

(21) Appl. No.: 10/907,738

(22) Filed: Apr. 14, 2005

(30) Foreign Application Priority Data

Oct. 6, 2004 (TW) .............................. 93130223 A (51) Int. Cl.
  *H03K 19/094* (2006.01)

(52) U.S. Cl. .......................................... 326/68; 326/81

(58) Field of Classification Search ............ 326/80–81, 326/68
  See application file for complete search history.

(56) References Cited

U.S. PATENT DOCUMENTS

| 5,469,080 | A | | 11/1995 | Son | |
|---|---|---|---|---|---|
| 5,675,278 | A | * | 10/1997 | Tanaka et al. | 327/333 |
| 5,914,617 | A | * | 6/1999 | Bartlett | 326/81 |
| 6,480,050 | B1 | | 11/2002 | Barnes | |
| 2004/0061525 | A1 | * | 4/2004 | Tamaki | 326/81 |

* cited by examiner

*Primary Examiner*—James H. Cho
(74) *Attorney, Agent, or Firm*—Winston Hsu (57) ABSTRACT

A level shifter has a current mirror and a set of oppositely driven NMOS switch. A voltage holding module is added to help an output of the level shifter to work with a full-swing fashion. Additionally, a DC current switch is used to eliminate a DC current.

20 Claims, 8 Drawing Sheets

LEVEL SHIFTER WITHOUT DC CURRENT FLOW

BACKGROUND OF INVENTION

1. Field of the Invention

The present invention relates to a level shifter, and more particularly, to a CMOS level shifter without DC current flow.

2. Description of the Prior Art

With advanced complementary metal oxide semiconductor (CMOS) technology, more and more circuits are integrated into a single chip. Therefore, the issue for heat dissipation of the chips is important. A simple way to reduce the heat is to decrease the working voltage of the chips. However, to increase the noise margin and avoid the noises from the external environment, the I/O circuits of the chips are usually applied higher voltage than the kernel circuits. Therefore, most of the chips are applied two working voltages. Level shifters, hence, are necessary to translate signals between two voltage supply domains.

Figure 1:
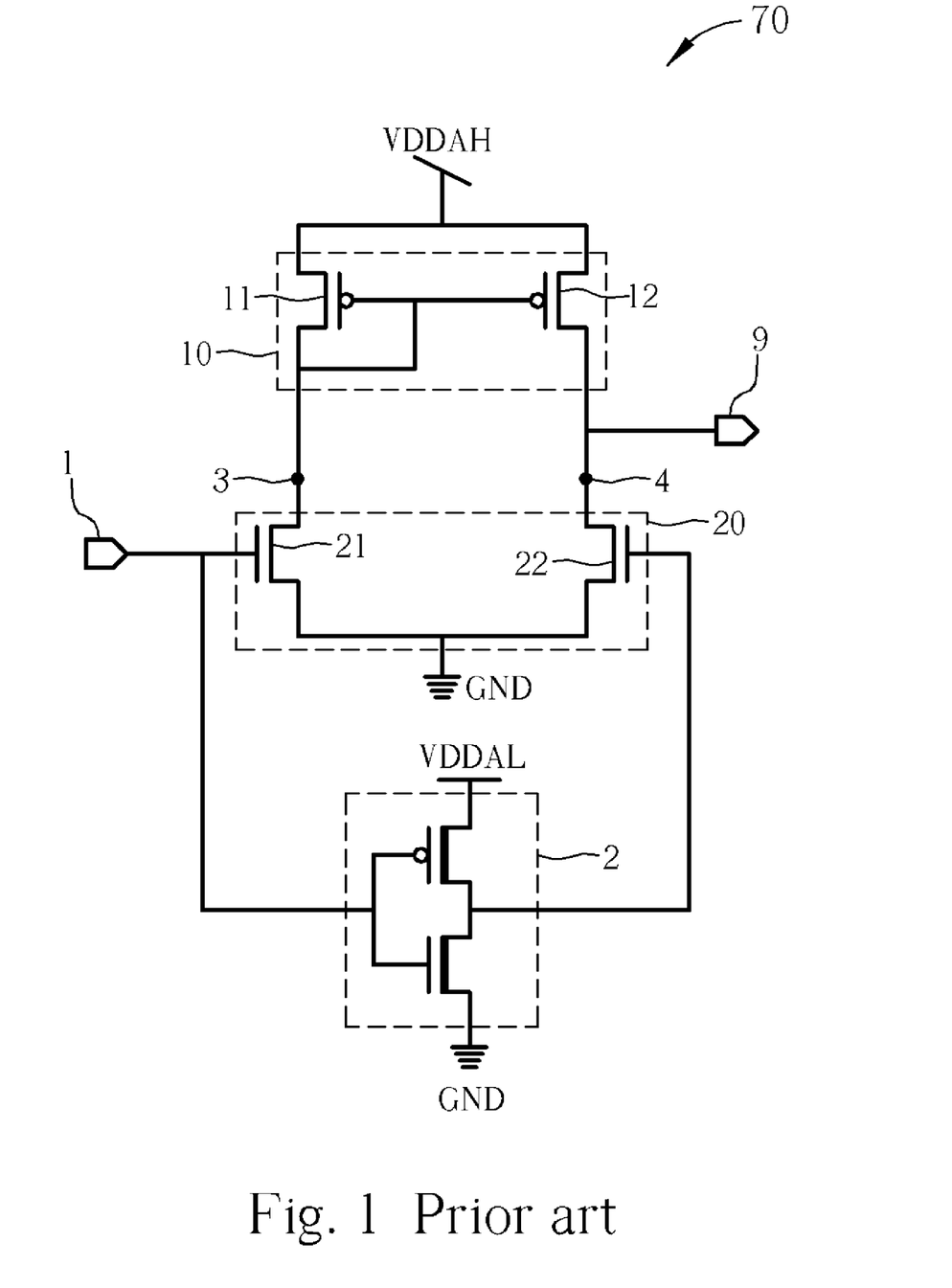
FIG. 1 is a circuit diagram of a level shifter according to the prior art.

Please refer to FIG. 1, which is a circuit diagram of a level shifter 70 according to the prior art. The level shifter 70 is used to translate signals between two voltage supply domains and has a current mirror structure. The level shifter 70 has an inverter 2, a current mirror 10, and a switch module 20. The inverter 2 outputs an inverted signal by inverting an input signal from an input node 1. The operation of the switch module 20 is controlled by the input signal from the input node 1 and the inverted signal from the output of the inverter 2. The current mirror 10 is composed of two gate-coupled PMOS transistors 111 and 12. The gate of the PMOS transistor 11 is further coupled to the drain of the PMOS transistor 11. The current mirror 10 is controlled by the two nodes 3 and 4. The switch module 20 comprises two NMOS transistors 21 and 22. The drains of the two NMOS transistors are respectively coupled to the node 3 and the node 4, and the gates of the two NMOS transistors are respectively biased by the input signal from the node 1 and the inverted signal from the output of the inverter 2. When the voltage level of the input signal from the node 1 is pulled up from the grounded level to VDDAL, the NMOS transistor 21 is turned on and the NMOS transistor 22 is turned off. In such case, the NMOS transistor 21 can be taken as a small resistor. According to Ohm's law, the current flows through the NMOS transistor 21 is equal to (VDDAH−|VGS|)/R, where VGS is the voltage difference between the gate and the source of the PMOS transistor 11, and R is the equivalent turn-on resistance of the NMOS transistor 21. The current flowing through the NMOS transistor 21 is mirrored to the PMOS transistor 12 of the current mirror 10 so that the voltage levels of the node 4 and an output terminal 9 are pulled up to VDDAH. If the voltage level of the node 1 keeps at VDDAL, the level shifter 70 generates a DC current which flows from the power terminal VDDAH through PMOS transistor 11 and the NMOS transistor 21 to a grounding terminal GND. In addition, when the voltage level of the node is pulled down from VDDAL to the grounded level, the NMOS transistor 21 is turned off and the NMOS transistor 22 is turned on. Meanwhile, because the NMOS transistor 21 is turned off, no current flows through the PMOS transistor 11. Therefore, the current mirror 10 and the PMOS transistor 12 are turned off. The voltage level of the output terminal, hence, is pulled down to grounded level via the turned on NMOS transistor 22.

Figure 2:
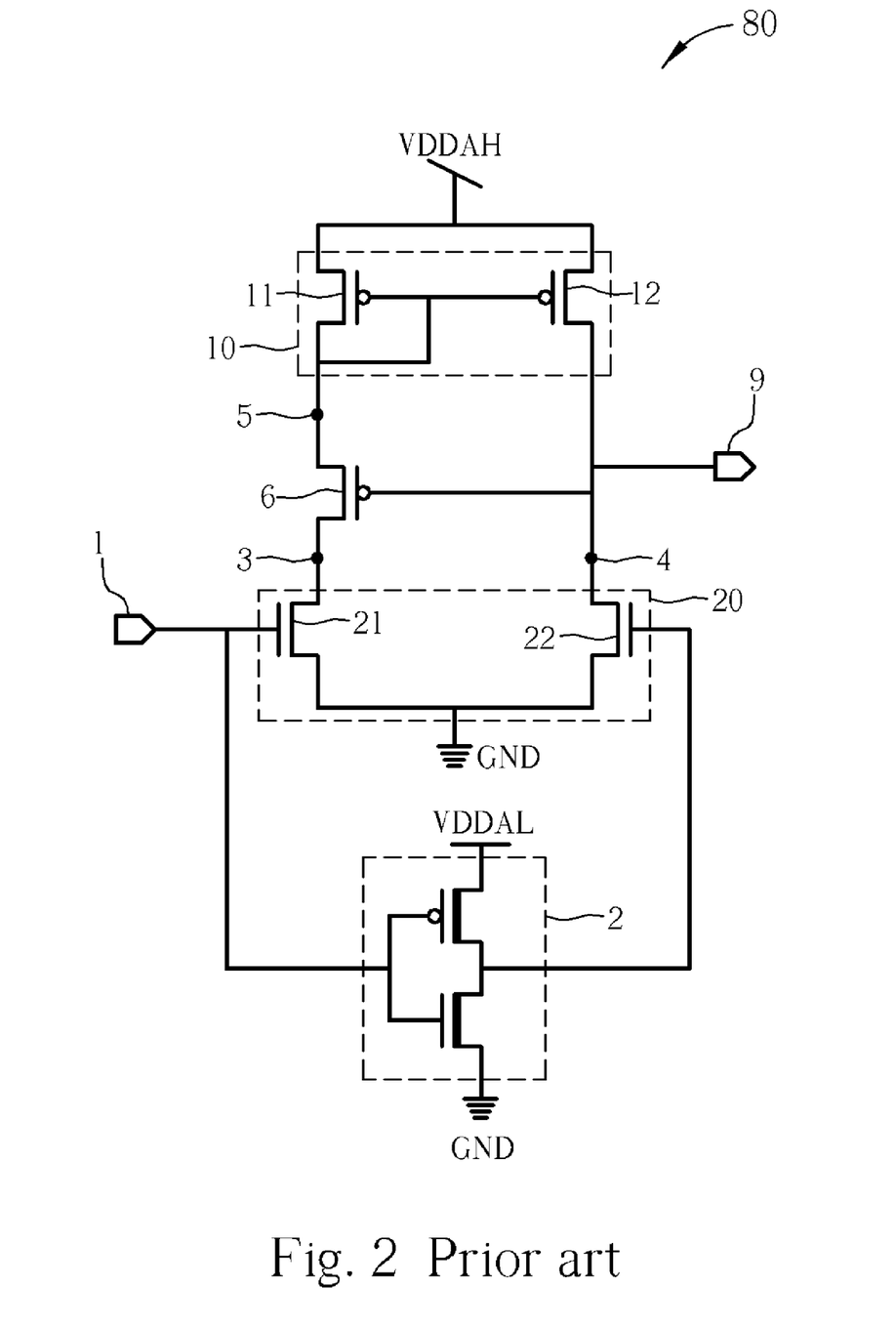
FIG. 2 is a circuit diagram of another level shifter according to the prior art.

Please refer to FIG. 2, which is a circuit diagram of another level shifter 80 according to the prior art. The level shifter 80 is disclosed in U.S. Pat. No. 5,469,080 "LOW-POWER, LOGIC SIGNAL LEVEL CONVERTER". The level shifter 80 uses a PMOS transistor 6 to control the electrical connection between the two nodes 3 and 5. The gate of the PMOS transistor 6 is feedback controlled by the node 4 so that the DC current flow is eliminated in a specific situation. When the node 1 is low, i.e. grounding, the NMOS transistor 22 is turned on so that the voltage level of the node 4 is pulled down to the grounded level. Then, the PMOS transistor 6 is turned on. When the voltage level of the node 1 is pulled up from the grounded level to VDDAL, the NMOS transistor 21 is turned on and the NMOS transistor 22 is turned off. At the moment, because the PMOS transistor 6 is still turned on, a transient current flows from the power terminal VDDAH through the PMOS transistor 11, the PMOS transistor 6 and the NMOS transistor 21 to the grounded terminal GND. The transient current is mirrored to the PMOS transistor 12 of the current mirror 10 so that the voltage level of the node 4 is pulled up to approach to VDDAH. Without concerning about the body effect of the transistors and assume all the PMOS transistors are identical, the PMOS transistor 6 is turned off when the voltage level of the node 4 is pulled up to (VDDAH−2Vtp), where Vtp is the threshold voltage of the PMOS transistors. However, when the PMOS transistor 6 is turned off, it is impossible to keep the current mirror 10 being turned on. In the situation, the voltage level of the node 4 stays at (VDDAH−2Vtp) and cannot be further pulled up to VDDAH. Therefore, the level shifter 80 is not a full-swing level shifter, and the circuits drived by the level shifter 80 may have DC current issues. Oppositely, when the voltage level of the node 1 is pulled down from VDDAL to the grounded level, the NMOS transistor 21 is turned off and the NMOS transistor 22 is turned on. Then, the voltage level of the node 4 is pulled down to the grounded level via the NMOS transistor 22. In this situation, the PMOS transistor 6 is turned on by the node 4, so it is impossible that NMOS transistor 21 and the PMOS transistor 6 are turned on at the same time. And, there is not any DC current generated.

Figure 3:
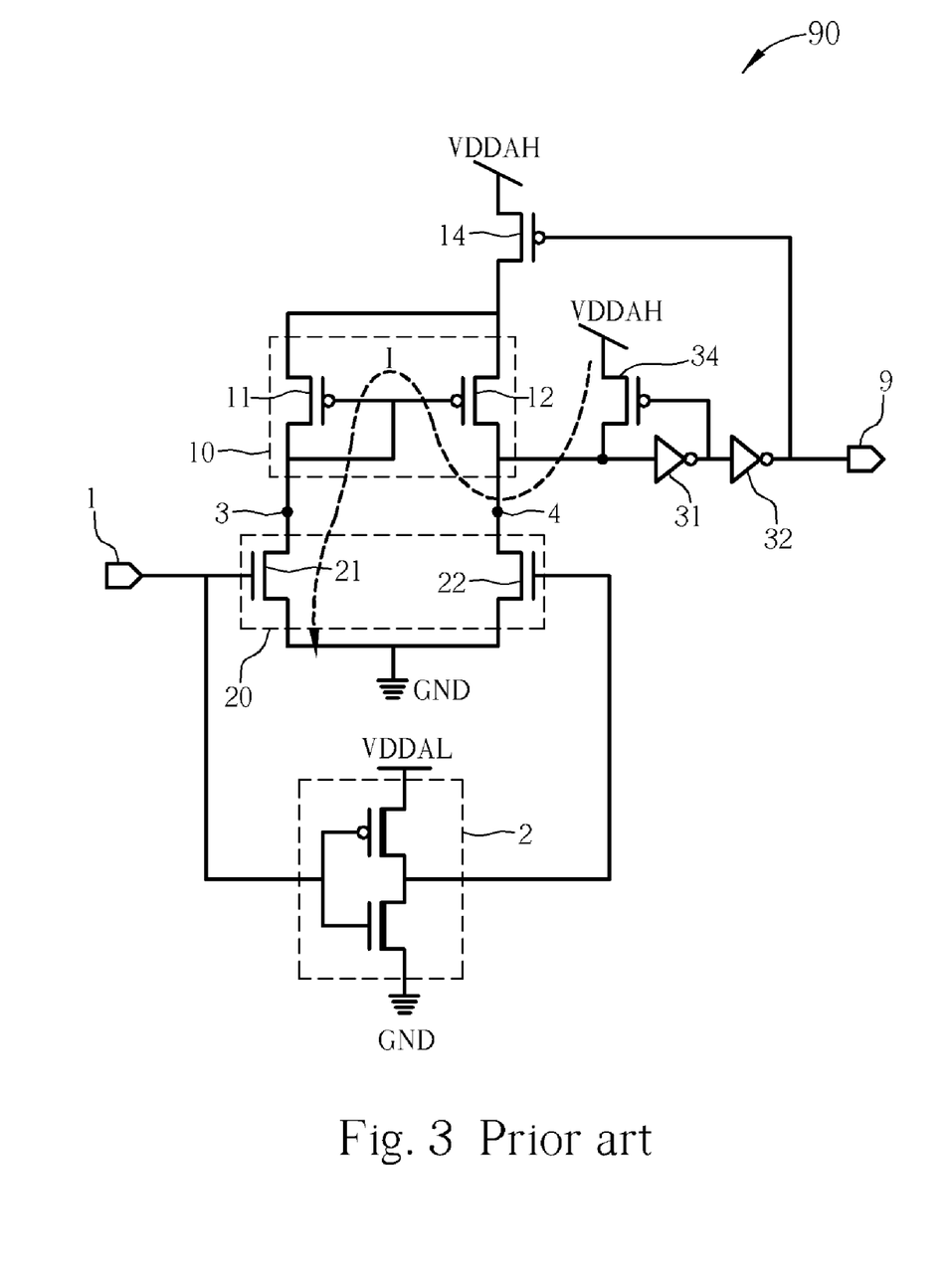
FIG. 3 is a circuit diagram of another level shifter according to the prior art.

Please refer to FIG. 3, which is a circuit diagram of another level shifter 90 according to the prior art. The level shifter 90 is disclosed in U.S. Pat. No. 6,480,050 "LEVEL SHIFTER WITHOUT QUIESCENT DC CURRENT FLOW". The level shifter 90 is based on the level shifter 70 shown in FIG. 1. The level shifter 90 has all the elements of the level shifter 70, moreover, a PMOS transistor 34, two inverters 31, 32, and a PMOS transistor 14. When the voltage level of the input node 1 is equal to VDDAL, because the inverters 31 and 32 are controlled by the node 4, the PMOS transistor 14 is turned off to avoid DC current. Meanwhile, the PMOS transistor 34 is turned on, another DC current path is occurred, i.e. the dotted line in FIG. 3. A DC current I flows from the power terminal VDDAH through the PMOS transistor 34, the PMOS transistor 12, the PMOS transistor 11, and the NMOS transistor 21 to the grounded terminal GND.

SUMMARY OF INVENTION

It is therefore a primary objective of the present invention to provide a novel level shifter to solve the above-mentioned problems.

The level shifter comprises a switch module, a power terminal, a current mirror, and a voltage holding module. The switch module has a first switch and a second switch. The switch module receives an input signal and turns on/off the first switch and the second switch according to the received input signal. The power terminal supplies a voltage to the level shifter. The current mirror is coupled to the power terminal and has a first node and a second node. The second node being coupled to the second switch. The voltage holding module has a control circuit and a third switch that is controlled by the control circuit. The control circuit is coupled to the third switch and the second node of the current mirror. The control circuit establishes electrical connection between the first switch and the first node of the current mirror by turning on the third switch.

According to another embodiment of the present invention, the level shifter comprises an input terminal, a first switch, a second switch, an inverter, a first power terminal, a second power terminal, a current mirror, and a voltage holding module. The input terminal receives an input signal. The first switch is connected to the input terminal. The inverter has an input connected to the input terminal and an output terminal connected to the second switch. The first power terminal supplies a first voltage to the level shifter. The second power terminal supplies a second voltage to the level shifter. The current mirror is coupled to the first power terminal and has a first node coupled to the first switch and a second node coupled to the second switch. The voltage holding module has a control circuit and a third switch that is controlled by the control circuit. The control circuit is coupled to the third switch and the second node of the current mirror. The control circuit establishes electrical connection between the first switch and the second power terminal by turning on the third switch.

According to another embodiment of the present invention, the level shifter has a switch module, a power terminal, a current mirror, and a voltage holding module. The switch module has a first switch and a second switch. The switch module receives an input signal and turns on/off the first switch and the second switch according to the received input signal. The power terminal for supplies a voltage to the level shifter. The current mirror is coupled to the power terminal and has a first control element, a second control element, a first node, and a second node. The first control element is coupled to the first switch via the first node, and the second control element is coupled to the second switch via the second node. The voltage holding module has a control circuit and a third switch that is controlled by the control circuit. The control circuit is coupled to the third switch and the second node of the current mirror. The control circuit establishes electrical connection between the first control element and the power terminal by turning on the third switch.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
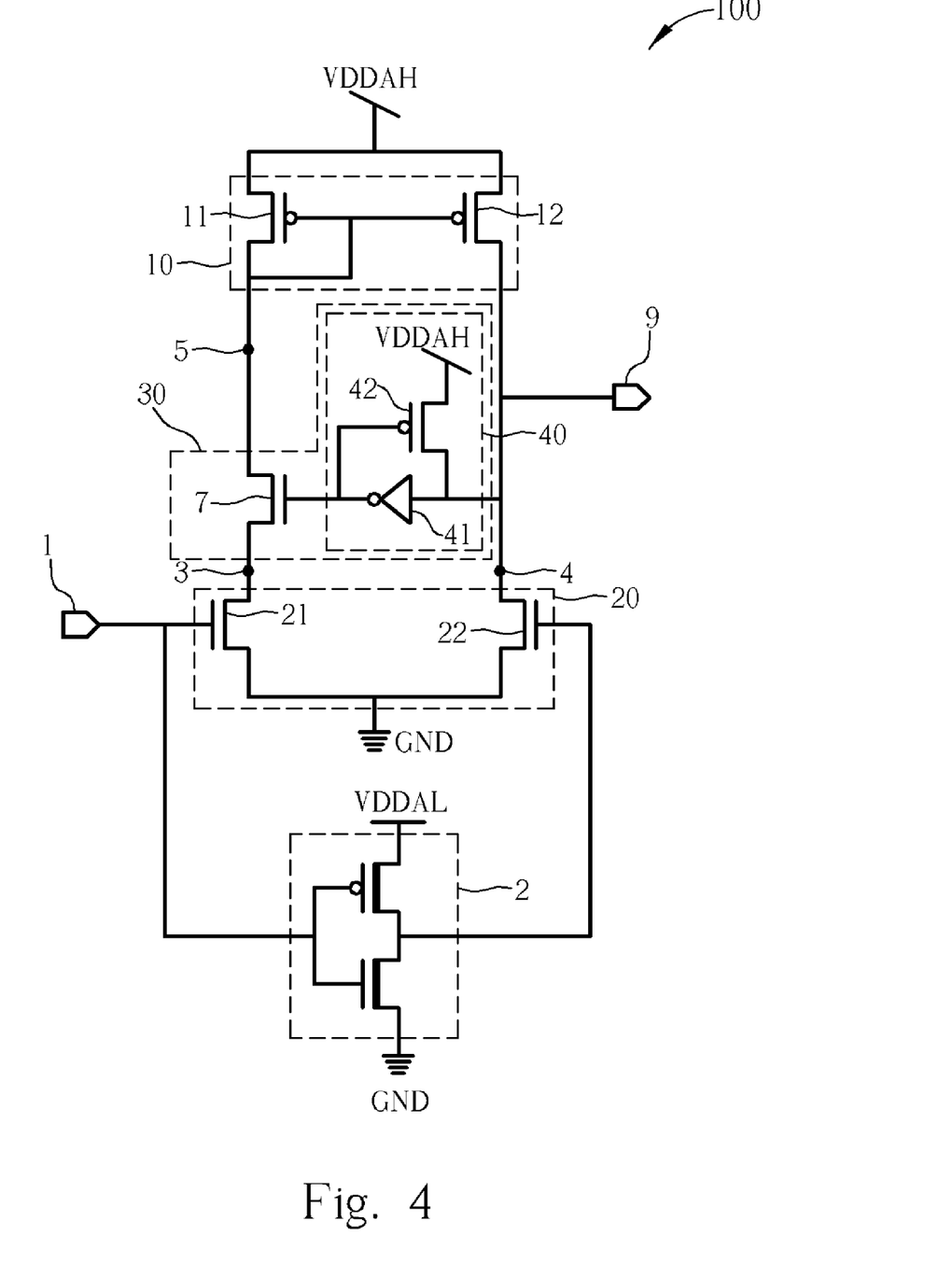
FIG. 4 is a first embodiment level shifter according to the present invention.

Please refer to FIG. 4, which is a first embodiment level shifter 100 according to the present invention. The level shifter 100 is used to translate signals between two voltage supply domains and has a current mirror 10. The current mirror 10 is composed of two gate-coupled PMOS transistors 11 and 12. The gate of the PMOS transistor 11 is coupled to the drain of the PMOS transistor 11. The current mirror 10 is controlled via the two nodes 4 and 5. The level shifter 100 further comprises an inverter 2, a power terminal VDDAH, a switch module 20, a voltage holding module 30, and a grounded terminal GND. The inverter 2 outputs an inverted signal by inverting an input signal from the input node 1. The switch module 20 has two switch NMOS transistors 21 and 22 that have drains respectively connected to the nodes 3 and 4 and gates biased by the nodes 1 and the output of inverter 2. The power terminal VDDAH is used to provide a voltage source, and the grounded terminal is used to provide the grounded level. It is noted that the grounded terminal can be replaced by another power terminal for providing another voltage source which has lower voltage level than the power terminal VDDAH. A voltage holding module 30 of the level shifter 100 has an NMOS transistor 7 and control circuit 40. The NMOS transistor 7 is controlled by the control circuit 40. The control circuit 40 has an inverter 41 controlled by the node 4 and a feedback PMOS transistor 42 which has a source, a drain, and a gate respectively connected to the power terminal VDDAH, the input terminal of the inverter 41, and the output terminal of the inverter 41. The gate of NMOS transistor 7 is connected to the output of the inverter 41, and the drain and the source of the NMOS transistor 7 are respectively coupled to the node 5 and the node 3. In addition, a path is formed by the power terminal VDDAH, the PMOS transistor 11, the NMOS transistor 7, the NMOS transistor 21, and the grounded terminal GND. Another path is formed by the power terminal VDDAH, the PMOS transistor 12, the NMOS transistor 22, and the grounded terminal GND. The control circuit 40 is connected between the two paths.

When the node 1 is low, i.e. grounded, the NMOS transistor 21 is turned off and the NMOS transistor 22 is turned on. The voltage level of the node 4 is pulled down to the grounded level. Then, the output of the inverter 41 is pulled up to VDDAH because of the grounded node 4. Therefore, the NMOS transistor 7 is turned on by the inverter 41. Oppositely, when the voltage level of the node 1 is pulled up from the grounded level to VDDAL, the NMOS transistor 21 is turned on and the NMOS transistor 22 is turned off. Meanwhile, because the NMOS transistor NMOS 7 is still turned on, a transient current flows from the power terminal VDDAH through the PMOS transistor 11, the NMOS transistor 7, and the NMOS transistor 21 to the grounded terminal GND. The transient current is mirrored to the PMOS transistor 12 of the current mirror 10 so that the voltage level of the node 4 is pulled up to VDDAH. When the voltage level of the node 4 is equal to VDDAH, the status of the inverter 41 is switched so that the NMOS transistor 7 is turned off. Therefore, there is no DC current generated. In addition, because the control circuit 40 is coupled to the power terminal VDDAH, the voltage level of the node 4 can be pulled up to VDDAH, i.e. not (VDDAH−2Vtp). Moreover, when the voltage level of the node 1 is pulled down from VDDAL to the grounded level, the NMOS transistor 21 is turned off, and the NMOS transistor 22 is turned on. Meanwhile, the voltage level of the node 4 is pulled down to the grounded level via the NMOS transistor 22, and the NMOS transistor 7 is turned on by the inverter 41. In such case, the NMOS transistor 21 and the NMOS transistor 7 present an AND logic style. Moreover, because the NMOS transistor 21 and the NMOS transistor 7 cannot be turned on at the same time when the level shifter 100 operates in a stable state, there is not any DC current when the level shifter 100 operates. In other words, the electrical connection between the NMOS transistor 21 and the node 5 is well controlled by the NMOS transistor 7 to avoid any DC current.

Figure 5:
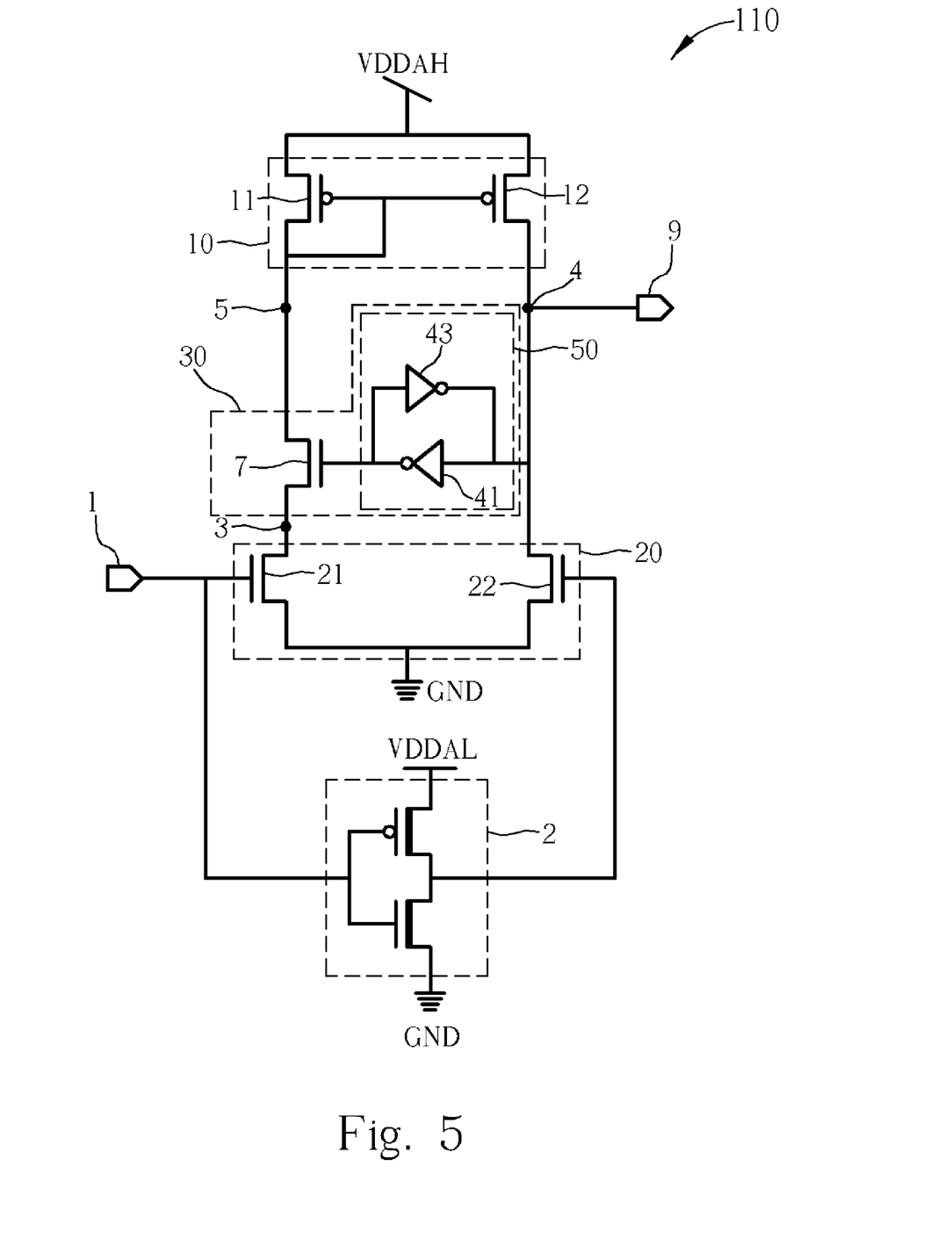
FIG. 5 is a circuit diagram of the second embodiment level shifter according to the present invention.

According to the present invention, the main function of the PMOS transistor 42 of the control circuit 40 is to pull up the voltage level of the node 4 to VDDAH so as to provide the level shifter 100 with a greater ability to overcome the noise from the output terminal 9. Therefore, as shown in FIG. 5, the PMOS transistor 42 of the level shifter 100 shown in FIG. 4 can be replaced by an inverter 43. FIG. 5 is a circuit diagram of the second embodiment level shifter 110 according to the present invention. The control circuit 40 shown in FIG. 4 is replaced by another control circuit 50. Because the two inverters 41 and 43 are connected to the power terminal VDDAH, the function of the control circuit 50 is the same as the function of the control circuit 40 that makes the level shifter output a full-swing supply voltage without any DC current flow.

Figure 6:
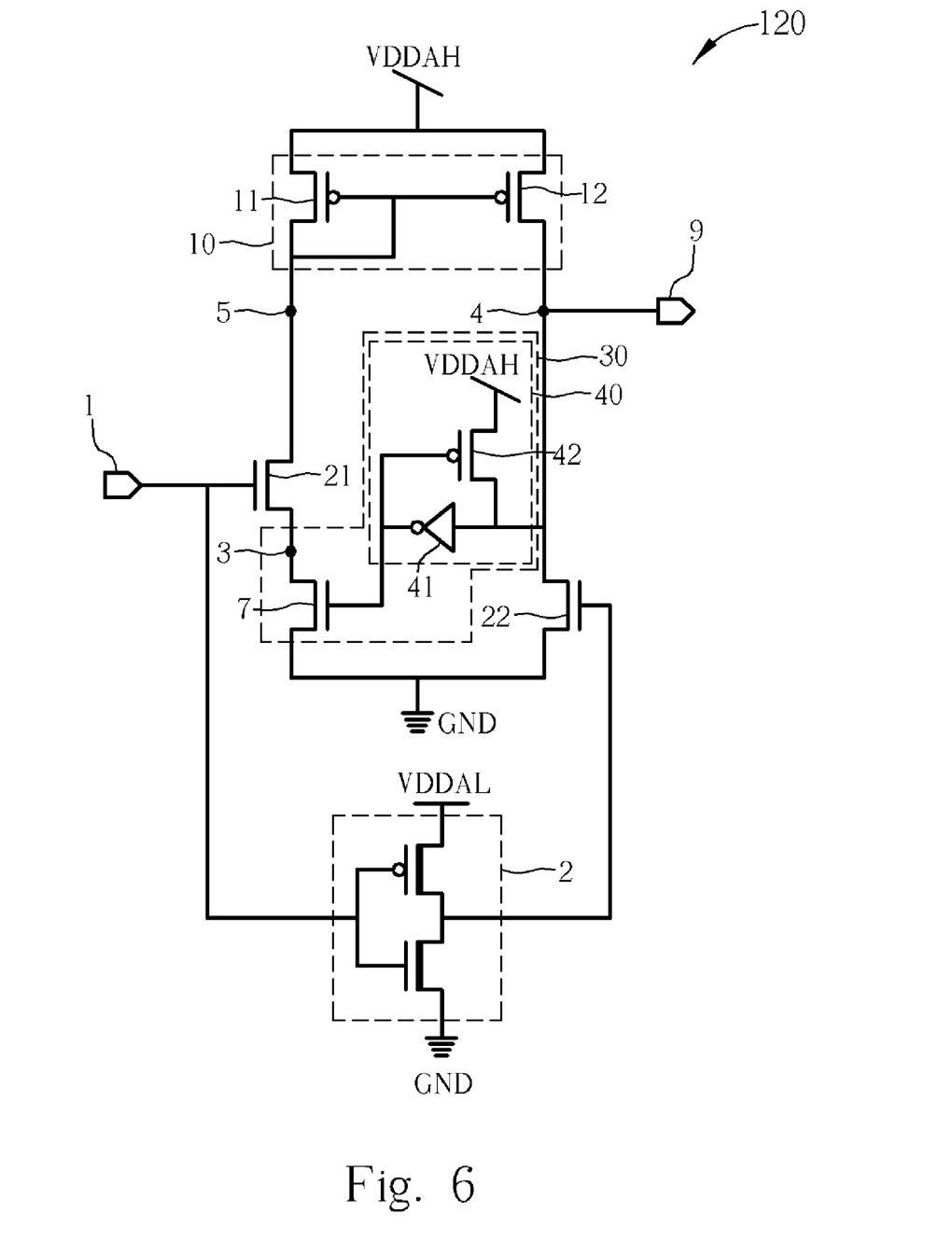
FIG. 6 is a circuit diagram of the third embodiment level shifter according to the present invention.

In addition, because the NMOS transistor 21 and the NMOS transistor 7 present an AND logic style, the positions of the two NMOS transistors 21 and 7 can be switched. Please refer to FIG. 6, which is a third embodiment level shifter 120 to indicate such situation. The control circuit 40 establishes the electrical connection between the node 3 and the grounded terminal GND by turning on the NMOS transistor 7 and abolishes the electrical connection between the node 3 and the grounded terminal GND by turning off the NMOS transistor 7.

Figure 7:
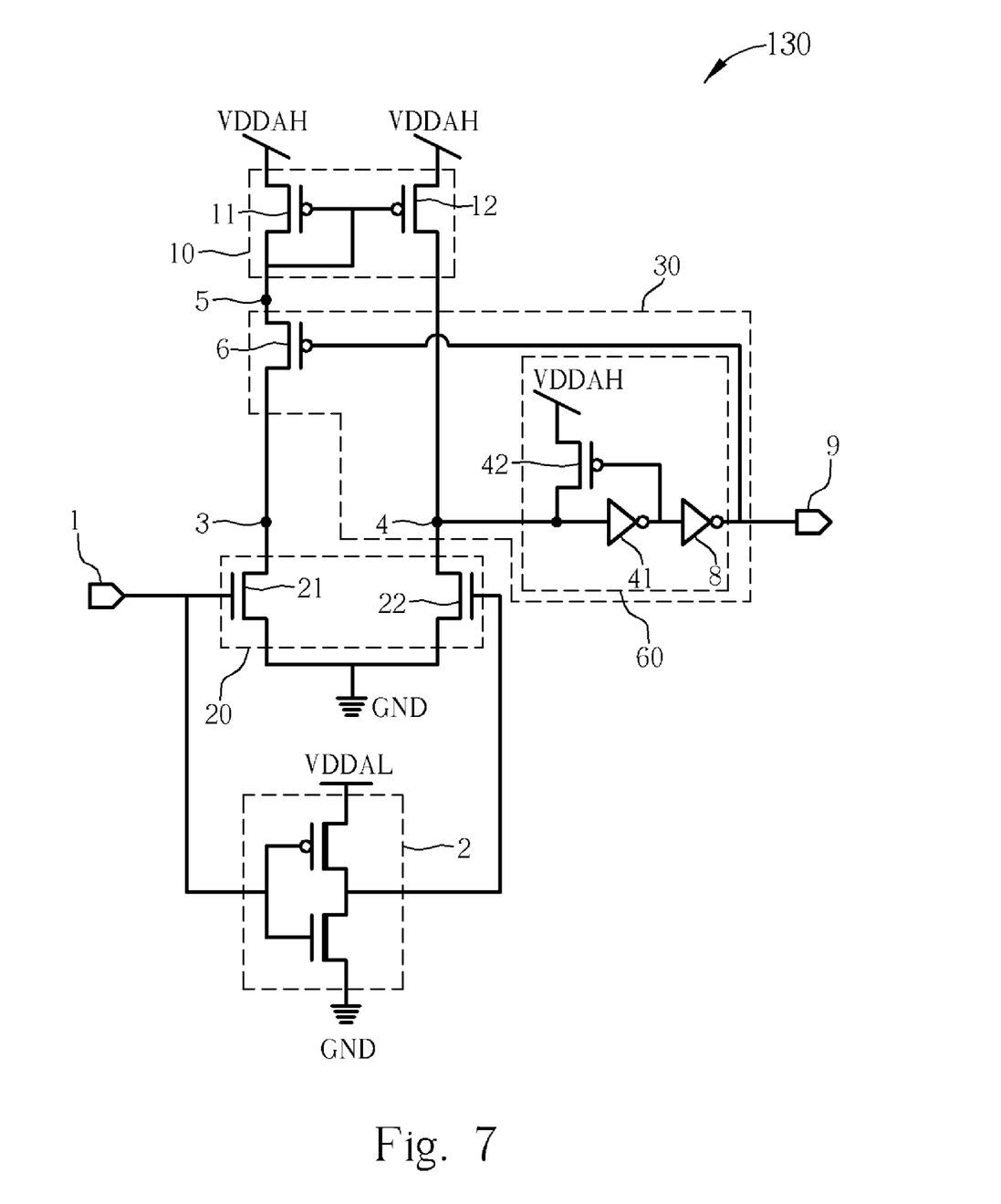
FIG. 7 is a circuit diagram of the fourth embodiment level shifter according to the present invention.
Figure 8:
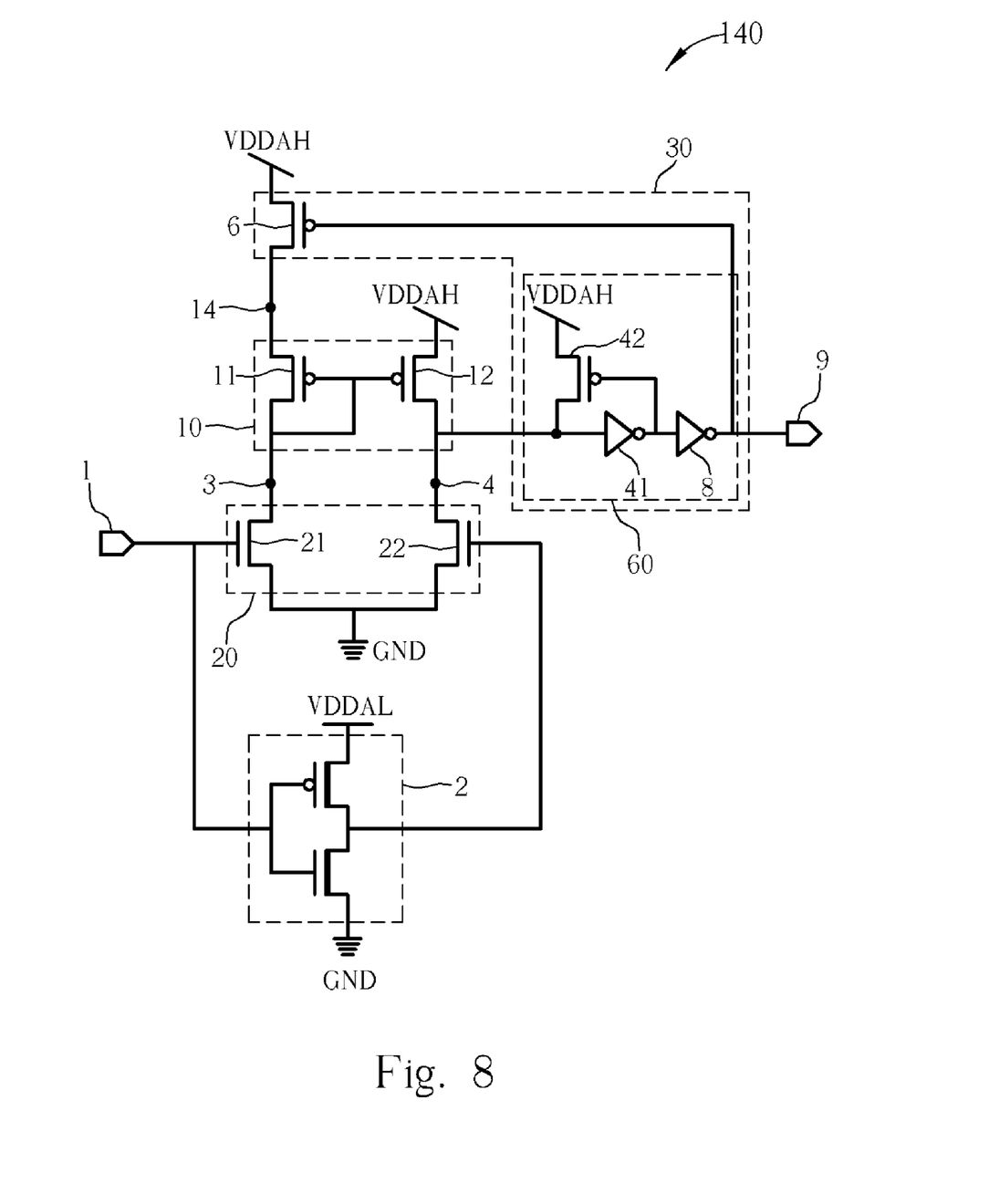
FIG. 8 is a circuit diagram of the fifth embodiment level shifter according to the present invention.

Moreover, because the PMOS transistor and the NMOS transistor are complementary elements, the NMOS transistor 7 of the voltage holding module 30 can be replaced by a PMOS transistor. Please refer to FIGS. 7–8, which FIG. 7 is a circuit diagram of a fourth embodiment level shifter 130 according to the present invention, and FIG. 8 is a circuit diagram of a fifth embodiment level shifter 140 according to the present invention. The NMOS transistor 7 is replaced by a PMOS transistor 6 and an inverter 8 is added to the control circuit 40 to compose another control circuit 60. The PMOS 6 of the level shifter 130 controls the electrical connection between the NMOS transistor 21 and the node 5, and the PMOS 6 of the level shifter 140 controls the electrical connection between the PMOS transistor 111 and the power terminal VDDAH.

It is noted that the current mirror 10 can be not only a simple circuit that is composed of two PMOS transistors 11 and 12, but also can be another kind of current mirror that has more complex circuit structure.

In the contrast to the prior art level shifter, the present invention provides a level shifter not only operates without generating any DC current flow, but also the output voltage supply is full-swing. Therefore, the wasted electric energy is less, and the ability to overcome the noise from the output terminal is greater.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A level shifter comprising:
    a switch module having a first switch and a second switch, the switch module receiving an input signal and turning on/off the first switch and the second switch according to the received input signal;
    a power terminal for supplying a voltage to the level shifter;
    a current mirror coupled to the power terminal having a first node and a second node, the second node being coupled to the second switch; and
    a voltage holding module having a control circuit and a third switch controlled by the control circuit, the control circuit being coupled to the third switch and the second node of the current mirror to establish electrical connection between the first switch and the first node of the current mirror by turning on the third switch.

2. The level shifter of claim 1 wherein the control circuit abolishes the electrical connection between the first switch and the first node of the current mirror by turning off the third switch.

3. The level shifter of claim 1 further comprising an output terminal coupled to the second node of the current mirror for outputting an output signal.

4. The level shifter of claim 1 further comprising an input terminal coupled to the switch module for receiving the input signal.

5. The level shifter of claim 4 wherein when a voltage level of the input signal is equal to a first voltage level, the first switch is turned off and the second switch is turned on.

6. The level shifter of claim 4 wherein when a voltage level of the input signal is equal to a second voltage level, the first switch is turned on and the second switch is turned off.

7. The level shifter of claim 1 wherein the voltage holding module is coupled to the power terminal.

8. A level shifter comprising:
    an input terminal for receiving an input signal;
    a first switch connected to the input terminal;
    a second switch;
    an inverter having an input connected to the input terminal and an output terminal connected to the second switch;
    a first power terminal for supplying a first voltage to the level shifter;
    a second power terminal for supplying a second voltage to the level shifter;
    a current mirror coupled to the first power terminal having a first node coupled to the first switch and a second node coupled to the second switch; and
    a voltage holding module having a control circuit and a third switch controlled by the control circuit, the control circuit being coupled to the third switch and the second node of the current mirror to establish electrical connection between the first switch and the second power terminal by turning on the third switch.

9. The level shifter of claim 8 wherein the control circuit abolishes the electrical connection between the first switch and the second power terminal by turning off the third switch.

10. The level shifter of claim 8 further comprising an output terminal coupled to the second node of the current mirror for outputting an output signal.

11. The level shifter of claim 8 wherein when a voltage level of the input signal is equal to a first voltage level, the first switch is turned off and the second switch is turned on.

12. The level shifter of claim 8 wherein when a voltage level of the input signal is equal to a second voltage level, the first switch is turned on and the second switch is turned off.

13. The level shifter of claim 8 wherein the voltage holding module is coupled to the first power terminal.

14. A level shifter comprising:
   a switch module having a first switch and a second switch, the switch module receiving an input signal and turning on/off the first switch and the second switch according to the received input signal;
   a power terminal for supplying a voltage to the level shifter;
   a current mirror coupled to the power terminal having a first control element, a second control element, a first node, and a second node, the first control element being coupled to the first switch via the first node, and the second control element being coupled to the second switch via the second node; and
   a voltage holding module having a control circuit and a third switch controlled by the control circuit, the control circuit being coupled to the third switch and the second node of the current mirror to establish electrical connection between the first control element and the power terminal by turning on the third switch.

15. The level shifter of claim 14 wherein the control circuit abolishes the electrical connection between the first control element and the power terminal by turning off the third switch.

16. The level shifter of claim 14 further comprising an output terminal coupled to the control circuit for outputting an output signal.

17. The level shifter of claim 14 further comprising an input terminal coupled to the switch module for providing the input signal.

18. The level shifter of claim 17 wherein when a voltage level of the input signal is equal to a first voltage level, the first switch is turned off and the second switch is turned on.

19. The level shifter of claim 17 wherein when a voltage level of the input signal is equal to a second voltage level, the first switch is turned on and the second switch is turned off.

20. The level shifter of claim 14 wherein the voltage holding module is coupled to the power terminal.

* * * * *